US009910827B2

(12) United States Patent
Muralimanohar et al.

(10) Patent No.: US 9,910,827 B2
(45) Date of Patent: Mar. 6, 2018

(54) VECTOR-MATRIX MULTIPLICATIONS INVOLVING NEGATIVE VALUES

(71) Applicant: Hewlett Packard Enterprise Development LP, Houston, TX (US)

(72) Inventors: Naveen Muralimanohar, Palo Alto, CA (US); Ben Feinberg, Rochester, NY (US); Ali Shafiee-Ardestani, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/201,040

(22) Filed: Jul. 1, 2016

(65) Prior Publication Data

US 2018/0004708 A1 Jan. 4, 2018

(51) Int. Cl.
| | |
|---|---|
| *G06G 7/16* | (2006.01) |
| *G06F 17/16* | (2006.01) |
| *H03M 1/12* | (2006.01) |
| *H03M 1/66* | (2006.01) |

(52) U.S. Cl.
CPC ............ *G06F 17/16* (2013.01); *H03M 1/12* (2013.01); *H03M 1/66* (2013.01)

(58) Field of Classification Search
CPC ............ G06F 17/16; H03M 1/12; H03M 1/66
USPC ......................................................... 708/835
See application file for complete search history.

(56) References Cited

U.S. PATENT DOCUMENTS

| | | |
|---|---|---|
| 6,393,554 B1 | 5/2002 | Oberman et al. |
| 6,504,943 B1 | 1/2003 | Sweatt et al. |
| 9,152,827 B2 | 10/2015 | Linderman et al. |

OTHER PUBLICATIONS

Li, B. et al., "Memristor-Based Approximated Computation", (Research Paper), 2013, 6 pages.
Nazm, M. et al., "Memrisfive Boltzmann Machine: A Hardware Accelerator for Combinatorial Optimization and Deep Learning", (Research Paper), Sep. 21, 2009, 13 pages.

*Primary Examiner* — Tan V. Mai
(74) *Attorney, Agent, or Firm* — Hewlett Packard Enterprise Patent Department

(57) ABSTRACT

Examples herein relate to circuits for computing vector-matrix multiplications involving negative values. A first memory crossbar array may be mapped to a first matrix which includes the positive values of an input matrix. A second memory crossbar array may be mapped to a second matrix which includes the negative values of the input matrix. An analog-to-digital converter may generate digital intermediate multiplication results based on analog results computed by the memory crossbar arrays. The digital intermediate multiplication results may include an intermediate result corresponding to a multiplication of each of the first vector and second vector with each of the first matrix and the second matrix. A controller may aggregate the digital intermediate results to generate a combined multiple result that represents the vector-matrix multiplication of the input vector and the input matrix.

15 Claims, 7 Drawing Sheets

US 9,910,827 B2

VECTOR-MATRIX MULTIPLICATIONS INVOLVING NEGATIVE VALUES

STATEMENT OF GOVERNMENT RIGHTS

This invention was made with Government support. The Government has certain rights in the invention.

BACKGROUND

A resistive memory array can be utilized to perform analog computations that exploit the fundamental relationship between row voltage and column current in a resistive mesh to realize an analog multiply-accumulate unit. Such a unit may be faster than a digital computation, and may also consume significantly lower energy than traditional digital functional units. The memory array is typically organized as a grid of cells interconnected by horizontal and vertical wires, referred to as word/row lines and bit/column lines. The fundamental relationship between a row access voltage and a resulting bit line current can act as an analog multiplier of row voltage and memory array cell conductance. Instead of accessing a single row as performed for loading and storing data, multiple rows can be activated concurrently according to an input voltage vector.

BRIEF DESCRIPTION OF THE DRAWINGS

The following detailed description references the drawings, wherein.

DETAILED DESCRIPTION

Figure 1:
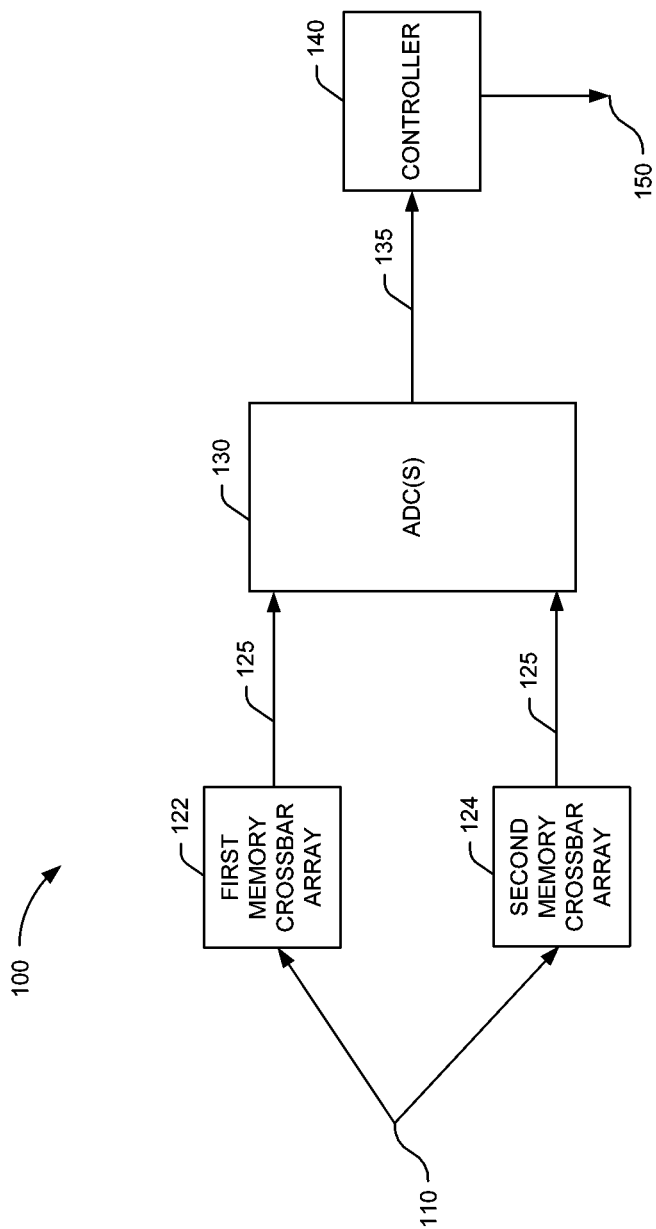
FIG. 1 is a diagram of an example circuit for performing analog vector-matrix computations.

Vector-matrix operations are mathematical functions used in various computer applications, including in data, image, sound, and video processing. Vector-matrix operations often involve a vector of values being multiplied by a matrix to produce a vector result. Examples of vector-matrix multiplications may include dot-product computations, linear transformations, cross-products, and others. However, vector-matrix multiplications may be very computation-intensive, and may be too resource-hungry to be optimally implemented with a general processor.

Memory cells are devices that may be used as components in a wide range of electronic circuits, such as memories, switches, radio frequency circuits, and logic circuits and systems. In a memory structure, a crossbar array of memory devices, which may include memristors, may be used. When used as a basis for memory devices, the resistance (or conductance) level of memory cell may be used to store a value. The resistance of a memory cell may be changed by applying an electrical stimulus, such as a voltage or a current, through the memory cell. Generally, at least one channel may be formed that is capable of being switched between at least two states—one in which the channel forms an electrically conductive path ("on") and one in which the channel forms a less conductive path ("off"). In some other cases, conductive paths represent "off" and less conductive paths represent "on". Furthermore, memory cells may also behave as an analog component with variable conductance. For example, a range of conductance levels of the memristor may be used to represent a range of analog values.

In some applications, a memory crossbar array can be used to perform vector-matrix computations. The use of memory cells at junctions or cross-point of the crossbar array enables programming the resistance (or conductance) at each such junction. For example, the highest and lowest resistance values of the memory cells in the memory array may correspond to a maximum and a minimum resistance of any memory cell in the array. Every other memory cell may be mapped to a resistance according to its ratio with the highest and lowest resistance values. Each element of an input vector may be converted into an analog input voltage and applied to each corresponding row line of the crossbar array. The input voltage from each row line of the crossbar is weighted by the conductance of the resistive memory cells in each column line and accumulated as the current output from each column line. Ideally, if wire resistances can be ignored, the current, I, flowing out of the crossbar array will be approximately $I^T=V^T G$, where V is the input voltage and G is the conductance matrix, including contributions from each memory cell in the crossbar array.

However, analog computations may not work properly if either or both of an input vector and an input matrix have negative values. Yet, negative numbers are involved in various real world applications. Examples disclosed herein provide for circuits for calculating vector-matrix multiplications involving negative values. Example circuits may include a first memory crossbar array and a second memory crossbar array. An input matrix may be split into a first matrix of all positive values and a second matrix of all negative values, which are respectively mapped to the first array and the second array. An analog-to-digital converter (ADC) may generate digital intermediate multiplication results based on analog results computed by the memory crossbar arrays. The digital intermediate multiplication results may include an intermediate result corresponding to a multiplication of each of the first vector and second vector with each of the first matrix and the second matrix. In this manner, a controller may aggregate the digital intermediate results to efficiently generate a combined multiple result that represents the vector-matrix multiplication of the input vector and the input matrix.

Referring now to the drawings, FIG. 1 illustrates an example circuit 100 for performing analog vector-matrix computations. Circuit 100 may be hardware unit that calculates vector-matrix multiplications. The circuit 100 may include a first crossbar array 122 and a second crossbar array 124, each configured to compute analog multiplications. The crossbar arrays may comprise a plurality of row lines, a plurality of column lines, and a memory cell coupled between each unique combination of one row line and one column line. Details of a memory crossbar array structure is described in further detail below in relation to FIG. 2.

An input matrix may be segregated into a first matrix and a second matrix, where the first matrix includes the positive elements of the input matrix, and the second matrix includes the negative elements. For example, the first matrix may include a copy of the input matrix with the negative elements of the input matrix set to zero in the first matrix. In contrast, the second matrix may include a copy of the input matrix with the positive elements of the input matrix set to zero in the second matrix. The first crossbar array 122 may be mapped according to the first matrix. The second crossbar array 124 may be mapped according to the second matrix. For example, the highest and lowest resistance values of the memory cells in the crossbar arrays may correspond to a maximum and a minimum resistance of any memory cell in the arrays. Every other memory cell may be mapped to a resistance according to its ratio with the highest and lowest resistance values.

Similarly, an input vector 110 may be segregated into a first vector having the positive elements of the input vector and a second vector having the negative elements of the input vector. For example, the first vector may include a copy of the input vector with the negative elements of the input vector set to zero in the first vector. The second vector, for example, may include a copy of the input vector with the positive elements of the input vector set to zero in the second vector. A digital to analog converter (DAC) (not shown) may be provided to generate analog representations of the first vector and the second vector. For example, the first vector may be converted to a first set of input voltages, and the second vector may be converted to a second set of input voltages. For example, the highest and lowest voltage values of the input voltages in the first set and second set of input voltages may correspond to a maximum and a minimum voltage. Every other input voltage may be mapped to a voltage according to its ratio with the highest and lowest input voltage values.

The first set of input voltages may be delivered by a controller, such as controller 140, to the first crossbar array 122 and to the second crossbar array 124. In some examples, the first set of input voltages may be delivered to both crossbar arrays in parallel. As explained in further detail herein, the set of input voltages may be delivered to the row lines of crossbar arrays 122 and 124. The interaction of the first set of input voltages with each crossbar array may each result in the delivery of a set of output currents 125 from each column line of the corresponding crossbar array (See description of FIG. 2). For example, a first set of output currents may represent an analog multiplication result of the first vector with the first matrix, and a second set of output currents may represent an analog multiplication result of the first vector with the second matrix.

The sets of output currents 125 may be delivered to at least one analog-to-digital converter (ADC) 130. ADC 130 may convert the output currents 125 to generate digital intermediate multiplication results 135. For example, the first set of output currents may be converted into a first digital intermediate result, and the second set of output currents may be converted into a second digital intermediate result. In some examples, the sets of digital intermediate results may be stored in an iteration buffer (not shown).

Similarly, the second set of input voltages may be delivered by controller 140, to first crossbar array 122 and to second crossbar array 124 via the row lines of each crossbar array. In some examples, the second set of input voltages may be delivered to both crossbar arrays in parallel. The interaction of the second set of input voltages with each crossbar array may each result in the delivery of a set of output currents 125 from each column line of the corresponding crossbar array (see description of FIG. 2). For example, a third set of output currents may represent an analog multiplication result of the second vector with the first matrix, and a fourth set of output currents may represent an analog multiplication result of the second vector with the second matrix.

ADC 130 may convert the output currents 125 to generate digital intermediate multiplication results 135. For example, the third set of output currents may be converted into a third digital intermediate result, and the fourth set of output currents may be converted into a fourth digital intermediate result. Thus, processing the input vector with the input matrix may generate four digital intermediate multiplication results—one from the first vector and the first matrix, one from the first vector and the second matrix, one from the second vector and the first matrix, and one from the second vector and the second matrix. All four of the digital intermediate results 135 may be delivered to controller 140, which may combine the digital intermediate results 135 to generate a combined multiplication result 150. Details of the components circuit 100 that perform the operations described herein are further described in detail in relation to following figures.

Figure 2:
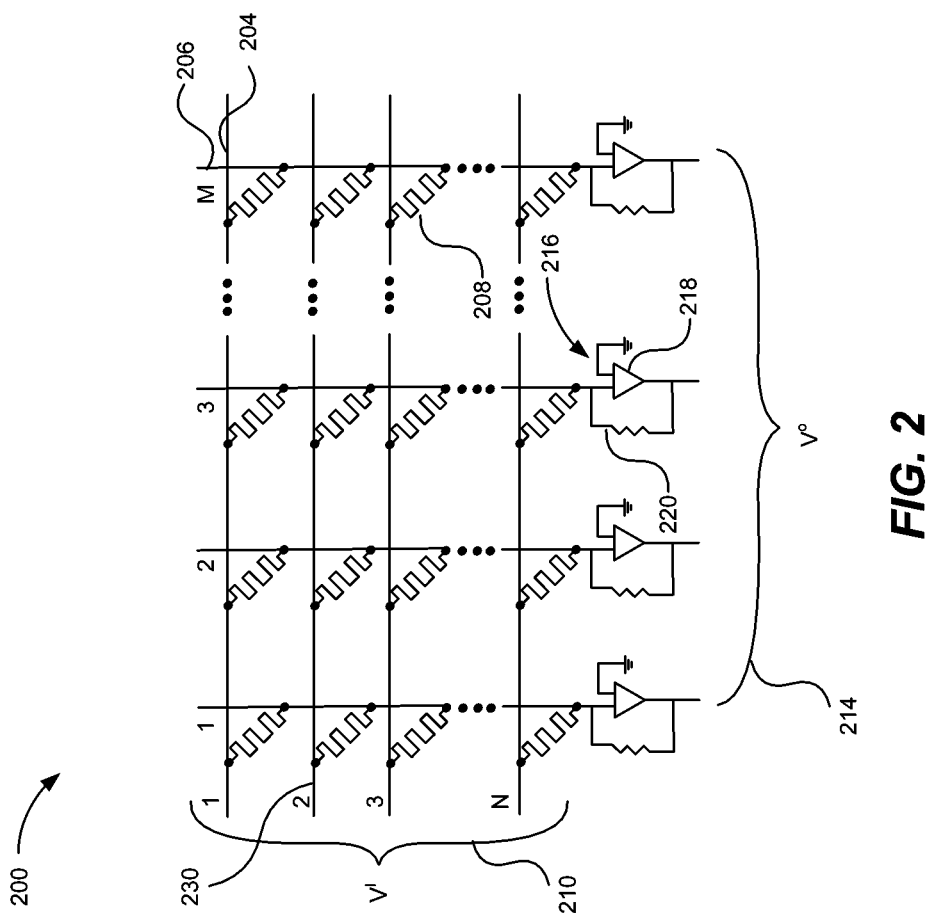
FIG. 2 is a diagram of an example memory crossbar array for performing analog vector-matrix computations.

FIG. 2 illustrates an example memory crossbar array 200 for performing analog vector-matrix computations. Crossbar array 200 may be a hardware unit that calculates vector-matrix multiplications. Specifically, crossbar array 200 may calculate a vector-matrix multiplication of an input vector with an input matrix.

Crossbar array 200 may be a configuration of parallel and perpendicular lines with memory cells coupled between lines at intersections. Crossbar array 200 may include a plurality of row lines 204, a plurality of column lines 206, and a plurality of memory cells 208. A memory cell 208 may be coupled between each unique combination of one row line 204 and one column line 206. In other words, no memory cell 208 shares both a row line and a column line.

Row lines 204 may be electrodes that carry current through crossbar array 200. In some examples, row lines 204 may be parallel to each other, generally with equal spacing. Row lines 204 may sometimes be, for example, a top electrode or a word line. Similarly, column lines 206 may be electrodes that run nonparallel to 204 lines 104. Column lines 206 may sometimes be, for example, a bottom electrode or bit line. Row lines 204 and column lines 206 may serve as electrodes that deliver voltage and current to the memory cells 208. Example materials for row lines 204 and column lines 206 may include conducting materials such as Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $Ti_5Si_3$, $TaSi_2$, $WSi_2$, $NbSi_2$, $V_3Si$, electrically doped polycrystalline Si, electrically doped polycrystalline Ge, and combinations thereof. In the example of FIG. 2, crossbar array 200 may have N row lines and M column lines.

Memory cells 208 may be coupled between row lines 204 and column lines 206 at intersections of the row lines 204 and column lines 206. For example, memory cells 208 may be positioned to calculate a new node values of an input vector of node values with respect to a weight matrix. Each memory cell 208 may have a memory device such as a resistive memory element, a capacitive memory element, or some other form of memory.

In some examples, each memory cell 208 may include a resistive memory element. A resistive memory element may have a resistance that changes with an applied voltage or current. Furthermore, in some examples, the resistive memory element may "memorize" its last resistance. In this manner, each resistive memory element may be set to at least two states. In many examples, a resistive memory element may be set to multiple resistance states, which may facilitate various analog operations. The multiple resistance states may allow the representation of various values in a matrix. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of crossbar array 200.

In some examples, memory cell 208 may include other components, such as access transistors or selectors. For example, each memory cell 208 may be coupled to an access transistor between the intersections of a row line 204 and a column line 206. Access transistors may facilitate the targeting of individual or groups of memory cells 208 for the purposes of reading or writing the memory cells.

Alternatively, a selector may be an electrical device that may be used in memristor devices to provide desirable electrical properties. For example, a selector may be a 2-terminal device or circuit element that admits a current that depends on the voltage applied across the terminals. In some examples, a selector may be coupled to each memory cell 208 to facilitate the targeting of individual or groups of memory cells 208. For example, a selector may do so by acting like an on-off switch, and it may mitigate sneak current disturbance.

The memory cells 208 of crossbar array 200 may be programmed according to an input matrix. The value stored in the memory cells 208 may represent the values of the input matrix. In implementations of resistive memory, the resistance levels of each memory cell 208 may represent a value of the input matrix. In such a manner, the input matrix may be mapped onto crossbar array 200.

Memory cells 208 may be programmed, for example, by having programming signals driven through them, which drives a change in the resistance range of the memory cells 208. The programming signals may define a number of values to be applied to the memory cells. As described herein, the values of memory cells 208 of crossbar array 200 may represent an input matrix as part of a vector-matrix multiplication operation.

Continuing to refer to FIG. 2, crossbar array 200 may receive a set of input voltages 210 at the plurality of row lines 204. The set of input voltages 210 may have been converted from an input vector by a digital-to-analog converter (DAC). A drive circuit may deliver the set of input voltages 210 to the crossbar array 200. In some examples, the voltages 210 may be other forms of electrical stimulus such as an electrical current driven to the memory cells 208. Furthermore, in some examples, the input vector may include numerical values, which may be converted to values in a range of voltage values.

Upon passing through the crossbar array 200, the plurality of column lines 206 may deliver output currents 214. The output currents 214 may represent analog multiplication results of crossbar array 200. In some examples, the analog results may be converted, by an analog-to-digital converter (ADC), to a set of digital results representing a vector-matrix multiplication of the input vector with the input matrix.

In some examples, crossbar array 200 may also include other peripheral circuitry. For example, an address decoder may be used to select a row line 204 and activate a drive circuit corresponding to the selected row line 204. The drive circuit for a selected row line 204 can drive a corresponding row line 204 with different voltages corresponding to an input vector or the process of setting resistance values within memory cells 208 of crossbar array 200. Similar drive and decode circuitry may be included for column lines 206. Control circuitry may also be used to control application of voltages at the inputs and reading of voltages at the outputs of crossbar array 200. As mentioned previously, DAC and ADC may be used for input voltages and the output currents. In some examples, the peripheral circuitry above described can be fabricated using semiconductor processing techniques in the same integrated structure or semiconductor die as crossbar array.

As described herein, there are two main operations that occur during operation of the crossbar array 200. The first operation is to program the memory cells 208 in the crossbar array 200 so as to map the mathematic values in an N×M input matrix to the array. In some examples, N and M may be the same number, and the weight matrix is symmetrical. In others, they are not. In some examples, one memory cell 208 is programmed at a time during the programming operation. The mapping process may begin with scanning of matrix elements for the highest (h) and the lowest (l) values. These values may correspond to the minimum and maximum resistances of memory cells 208. Every other element is then mapped to a resistance according to its ratio with h and l. In some examples, the mapping process may be more complex than the linear mapping mentioned above. For instance, the effect of parasitic such as IR drop, data pattern, and location of a cell and so forth can change how a value is mapped to a cell conductance.

To map a matrix of values $[a_{ij}]$ onto crossbar array 200 or, stated otherwise, programming—e.g., writing—conductance values into the crossbar junctions of the crossbar array 200, in some examples each of the conductance values $G_{ij}$ may be set by sequentially imposing a voltage drop over each of the memory cells 208. For example, the conductance value $G_{2,3}$ may be set by applying a voltage equal to $V_{Row2}$ at the $2^{nd}$ row line 204 of crossbar array 200 and a voltage equal to $V_{col3}$ at the $3^{rd}$ column line 206 of the array. The voltage input, $V_{Row2}$, may be applied to the $2^{nd}$ row line at a location 230 occurring at the $2^{nd}$ row line adjacent the j=1 column line. The voltage input, $V_{Col3}$, will be applied to the $3^{rd}$ column line adjacent either the i=1 or i=N location. Note that when applying a voltage at a column line 206, the sense circuitry for that column line may be switched out and a voltage driver switched in. The voltage difference $V_{Row2}$−$V_{Col3}$ will generally determine the resulting conductance value $G_{2,3}$ based on the characteristics of the memory cell 208 located at the intersection. When following this approach, the unselected column lines 206 and row lines 204 may be addressed according to one of several schemes, including, for example, floating all unselected column lines 206 and row lines 204 or grounding all unselected column lines and row lines. Other schemes involve grounding column lines 206 or grounding partial column lines 206. Grounding all unselected column lines and row lines is beneficial in that the scheme helps to isolate the unselected column lines and row lines to minimize the sneak path currents to the selected column line 206.

In accordance examples herein, a device such as a memristor used in memory cells 208 may have linear current-voltage relation. Linear current-voltage relations permit higher accuracy in the matrix multiplication process. However, crossbar arrays 200 having linear memory cells 208 are prone to having large sneak path currents during programming of the array 200, particularly when the size of crossbar array 200 is larger than a certain size, for instance, 32×32. In such cases, the current running through a selected memory cell may not be sufficient to program the memory cell because most of the current runs through the sneak paths. Alternatively, the memory cell may be programmed at an inaccurate value because of the sneak paths.

To alleviate the sneak path currents in such instances, and especially when larger arrays are desired, an access device, such as an access transistor or a non-linear selector, may be incorporated within or utilized together with a device such as memristor to minimize the sneak path currents in the array. More specifically, memory cell 206 should be broadly interpreted to include memristive devices including, for example, a resistive memory element, a memristor, a memristor and transistor, or a memristor and other components.

The second operation is to calculate an output current by computing the dot-product of input voltage and the resistance values of the memory cells 208 of a column line 206. In this operation, input voltages are applied and output currents obtained, corresponding to the result of multiplying an N×M matrix by an N×1 vector. N voltage inputs may be multiplied with G, which may be the column conductance values representing the M vector of the matrix, where N, M, and G are positive integers respectively.

For example, every column may a transimpedance amplifier such as shown at 218, which may in turn be connected to an ADC to digitize the output current from the respective column lines 206. Generally, an ADC requires more silicon real estate than a crossbar array. To reduce the total area, an ADC may be operated at higher frequency and time multiplexed across multiple column lines 206. Finally, a set of configuration registers (not shown) may specify a number of valid output bits (No) from the ADC, number of simultaneous rows that can be activated (NR), and bit density of cells (Cb). These configuration registers may help tailor the crossbar array 200 to different applications dynamically.

Finally, the output current may be collected by the transimpedance amplifier 218 with a reference resistance RS. The output current IO=ΣVi.Gi reflects the corresponding dot-product operation. This value is then digitized using an ADC. The parameters of the crossbar array 200 such as number of levels in a cell, analog to digital converter specification (ADC bits), digital to analog converter specification (size of input bits to DAC), and the size of the crossbar array are all coupled to each other. To mitigate data loss, the ADC specification should meet the following requirement, where NR is the number of rows activated in DPE mode, DACb is the input bit width of DAC, and Mb is the number of bits stored in a memory cell. The following Equation 1 specifies ADC and DAC combinations that can be dynamically specified via register settings.

$$ADCbits = \begin{cases} \log2(N_R) + DAC_b + M_b & \text{if } DAC_b > 1 \\ \log2(N_R) + M_b & \text{if } DAC_b = 1 \\ \log2(N_R) + DAC_b & \text{if } M_b = 1 \end{cases}$$

Crossbar array 200 may be implemented as a part of a hardware accelerator in a computing device. Example computing devices that include an example accelerator may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that perform the functions described herein.

Figure 3:
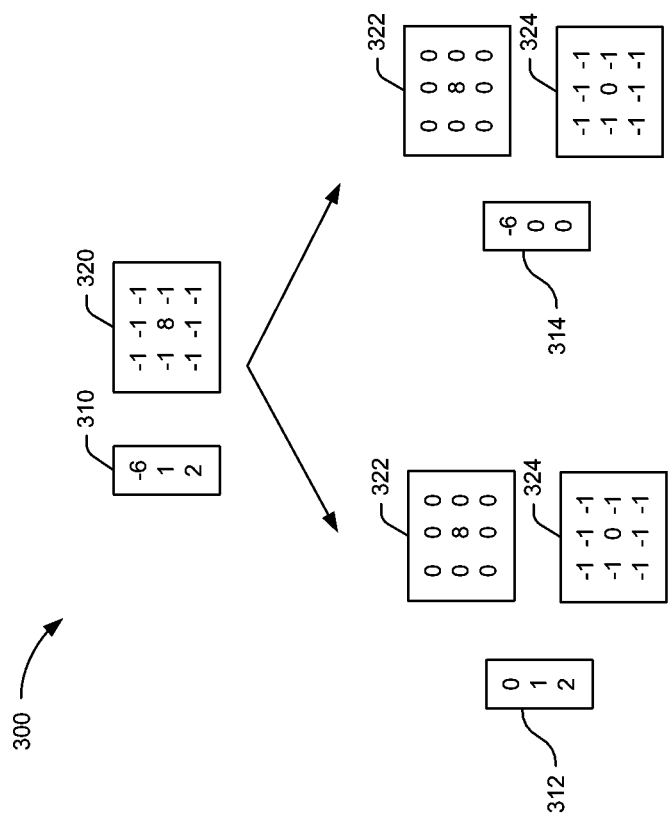
FIG. 3 is a diagram of an example vector-matrix computation.

FIG. 3 conceptually illustrates an example vector-matrix computation 300. The computation illustrated in FIG. 3 may be implemented, for example, by circuit 100 of FIG. 1 and/or crossbar array 200 of FIG. 2. 310 shows an input vector 310, which includes both positive and negative numbers. 320 shows an input matrix 320, which includes both positive and negative numbers.

Input vector 310 may be segregated into a first vector 312 having the positive elements of the input vector and a second vector 314 having the negative elements of the input vector. As illustrated in FIG. 3, first vector 312 may include a copy of input vector 310 with the negative elements of the input vector set to zero in the first vector 312. Second vector 314, for example, may include a copy of the input vector 310 with the positive elements of the input vector set to zero in the second vector 314. As explained previously, the first vector 312 may be converted to a first set of input voltages, and the second vector 314 may be converted to a second set of input voltages. For example, the highest and lowest voltage values of the input voltages in the first set and second set of input voltages may correspond to a maximum and a minimum voltage, including negative values. Every other input voltage may be mapped to a voltage according to its ratio with the highest and lowest input voltage values. For the example illustrated in FIG. 3, the lowest voltage value in the input voltages may correspond to the value −6 in the input vector 310, and the highest voltage value may correspond to the value 2, with the value 1 being represented by a voltage according to its ratio between −6 and 2.

Similarly, input matrix 320 may be segregated into a first matrix 322 and a second matrix 324, where the first matrix includes the positive elements of the input matrix, and the second matrix includes the negative elements. For example, the first matrix 322 may include a copy of the input matrix 320 with the negative elements of the input matrix set to zero in the first matrix. In contrast, the second matrix 324 may include a copy of the input matrix 320 with the positive elements of the input matrix set to zero in the second matrix. As explained previously, a first crossbar array may be mapped according to the first matrix 322. A second crossbar array may be mapped according to the second matrix 324. For example, the highest and lowest resistance values of the memory cells in the crossbar arrays may correspond to a maximum and a minimum resistance of any memory cell in the arrays, including negative values. Every other memory cell may be mapped to a resistance according to its ratio with the highest and lowest resistance values. For the example illustrated in FIG. 3, the lowest resistance value of the memory cells may correspond to the value −1 in the input matrix 320, and the highest resistance value may correspond to the value 8.

The first set of input voltages representing first vector 312 may be delivered to a first crossbar array representing first matrix 322 and to a second crossbar array representing second matrix 324. In some examples, the first set of input voltages may be delivered to both crossbar arrays in parallel. A first set of output currents from the first crossbar array may represent an analog multiplication result of the first vector 312 with the first matrix 322, and a second set of output currents from the second crossbar array may represent an analog multiplication result of the first vector 312 with the second matrix 324.

Similarly, the second set of input voltages representing second vector 314 may be delivered to the first crossbar array representing first matrix 322 and to the second crossbar array representing second matrix 324. In some examples, the second set of input voltages may be delivered to both crossbar arrays in parallel. A third set of output currents from the first crossbar array may represent an analog multiplication result of the second vector 314 with the first matrix 322, and a fourth set of output currents from the second crossbar array may represent an analog multiplication result of the second vector 314 with the second matrix 324.

In some examples, the analog multiplication results may be converted into digital intermediate result, which may be combined to generate a combined multiplication result representing the vector-matrix multiplication of input vector 310 and input matrix 320. It should be noted that combining the digital intermediate results may account for the signs of the numerical values. For example, negative values may be subtracted while positive values are added.

Figure 4:
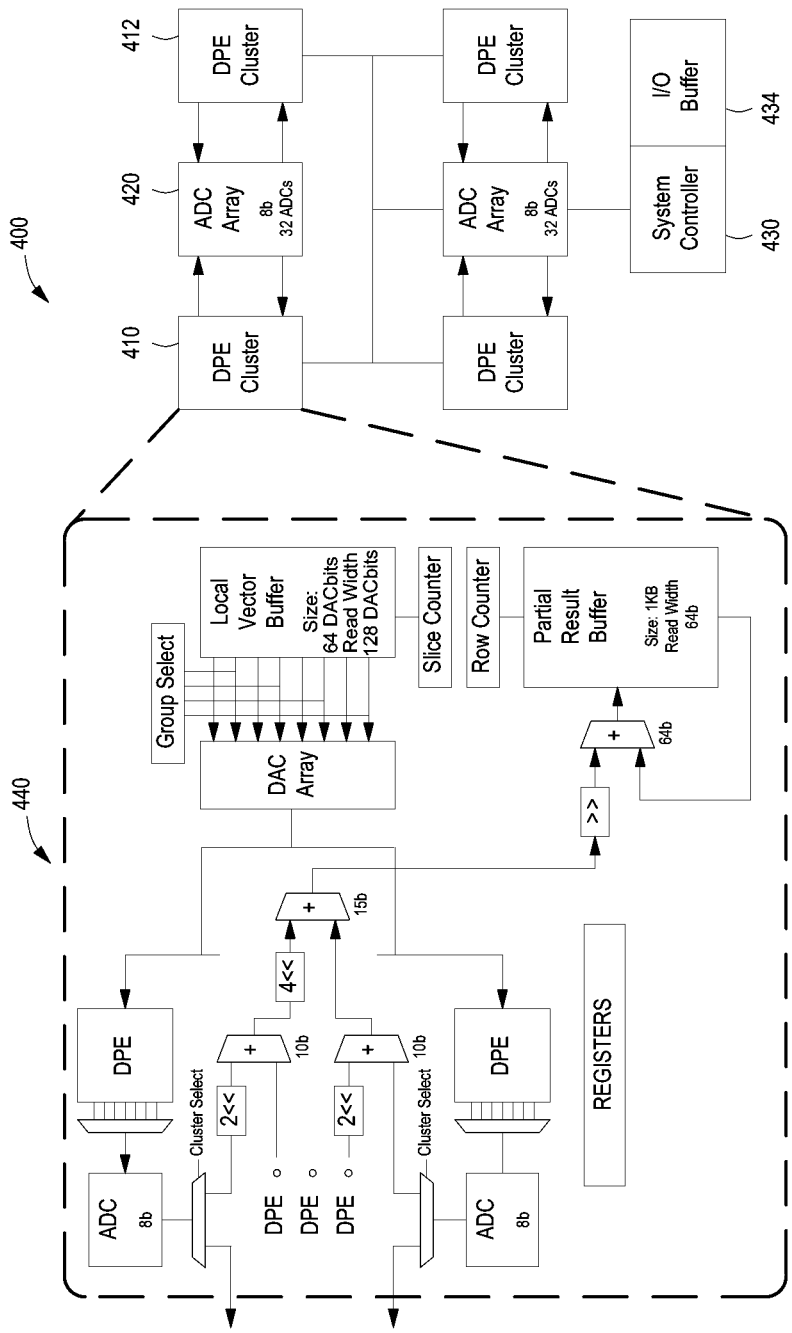
FIG. 4 is a diagram of a circuit that utilizes cluster processing to perform analog vector-matrix computations.

FIG. 4 illustrates an example of a circuit 400 that utilizes cluster processing to perform analog submatrix computations from input matrix values. For example, when an input matrix is segregated into a first and second matrix respectively having the positive and negative values of the input matrix, each of the first and second matrices can be considered a submatrix for purposes of illustrating FIG. 4. In this example, multiple dot-product engine (DPE) clusters are shown, including labels 410 and 412, are employed to perform the submatrix processing described herein. Clusters 410 and 412 may utilize a common ADC array 420. A system controller 430 and I/O buffer 434 may be provided for managing and aggregating results within the respective clusters. In some examples, the cluster 410 (e.g., first cluster) can compute a first intermediate result of the input matrix. The cluster 412 (e.g., second cluster) can compute a second intermediate result of the input matrix. The analog to digital converter (ADC) array 420 digitizes the first and second intermediate results, respectively from the clusters 410 and 412. Similarly, a third and fourth intermediate result may also be computed using clusters 410 and 412, where then all four intermediate results may be combined.

An example high-level block diagram of a given cluster is shown at 440. Each cluster may include a plurality of engines formed from a memristor array to compute analog multiplication results between vectors of a matrix, which may be a portion of an input matrix. In some examples, each cluster shown at 440 may include adders to add or substract intermediate results. Circuit 400 illustrates an example architecture for handling the vector-matrix operations discussed herein.

Figure 5:
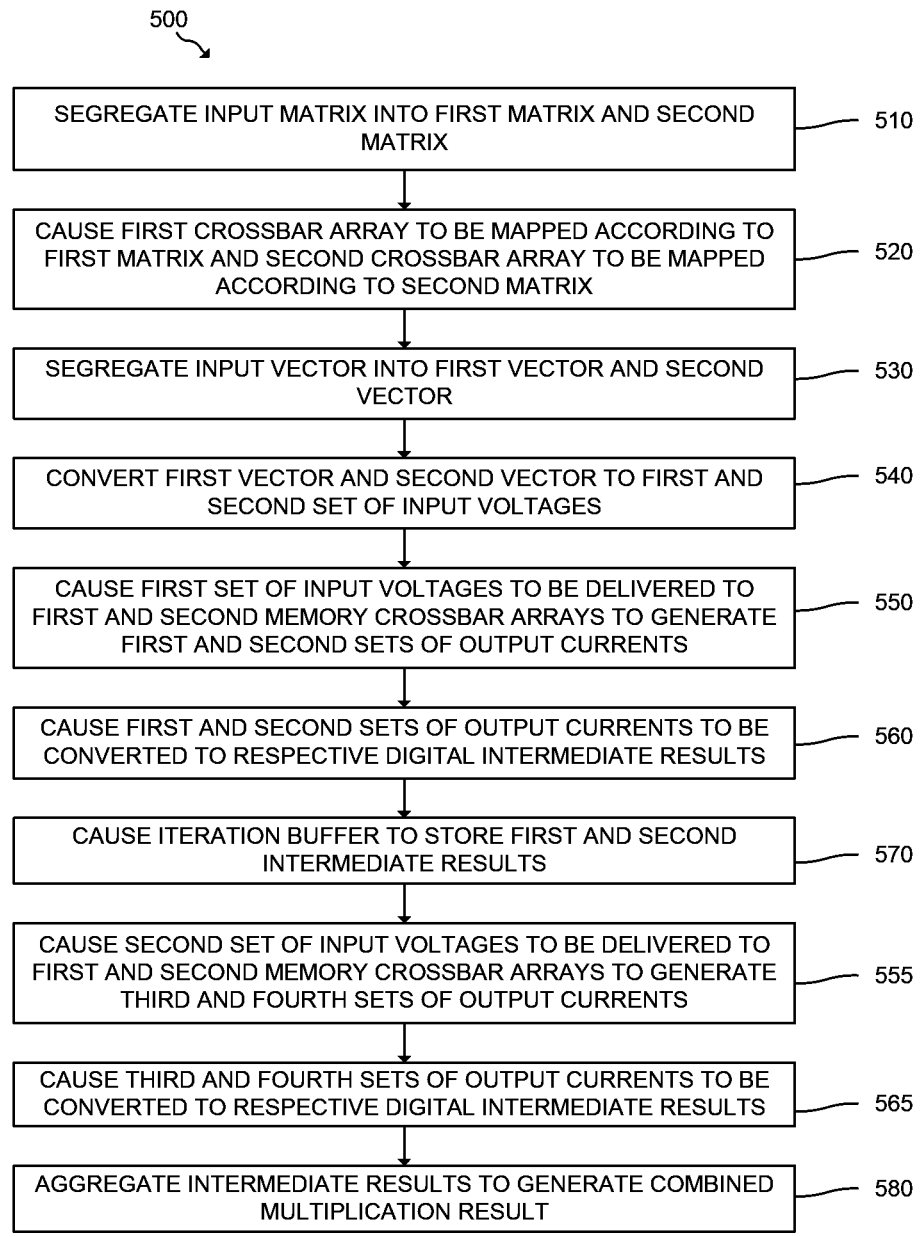
FIG. 5 is an example method for performing analog vector-matrix computations.

FIG. 5 depicts a flowchart of an example method 500 for performing analog vector-matrix computations. Although execution of method 500 is herein described in reference to the examples illustrated herein in FIG. 1-4, other suitable examples of method 500 should be apparent.

In an operation 510, an input matrix may be segregated into a first matrix and a second matrix. The first matrix may include the positive elements of the input matrix, and the second matrix may include the negative elements. As illustrated in FIG. 3, a first matrix 322 may include a copy of an input matrix 320 with the negative elements of the input matrix set to zero in the first matrix. In contrast, a second matrix 324 may include a copy of the input matrix 320 with the positive elements of the input matrix set to zero in the second matrix.

In an operation 520, the memory cells 108 of the crossbar array 102 may be programmed according to the conductance values converted in operation 510. For example, a first crossbar array 122 of circuit 100 of FIG. 1 may be mapped according to the first matrix 322 of FIG. 3. A second crossbar array 124 may be mapped according to the second matrix 324. For example, the highest and lowest resistance values of the memory cells in the crossbar arrays may correspond to a maximum and a minimum resistance of any memory cell in the arrays. Every other memory cell may be mapped to a resistance according to its ratio with the highest and lowest resistance values.

In an operation 530, an input vector may be segregated into a first vector and a second vector. The first vector may include the positive elements of the input vector, and the second vector may include the negative elements. As illustrated in FIG. 3, a first vector 312 may include a copy of an input vector 310 with the negative elements of the input vector set to zero in the first vector. In contrast, a second vector 314 may include a copy of the input vector 310 with the positive elements of the input vector set to zero in the second vector.

In an operation 540, the first vector may be converted to a first set of input voltages, and the second vector may be converted to a second set of input voltages. For example, the highest and lowest voltage values of the input voltages in the first set and second set of input voltages may correspond to a maximum and a minimum voltage, including negative values. Every other input voltage may be mapped to a voltage according to its ratio with the highest and lowest input voltage values.

In an operation 550, the first set of input voltages may be delivered to the first and second memory arrays to generate a first and second set of output currents, respectively. In some examples, the first set of input voltages may be delivered to both crossbar arrays in parallel. The first set of output currents from the first crossbar array may represent an analog multiplication result of the first vector with the first matrix, and a second set of output currents from the second crossbar array may represent an analog multiplication result of the first vector with the second matrix. In an operation 560, the first and second sets of output currents may be converted, by an ADC, to a first and second set of digital intermediate results. In an operation 570, the first and second intermediate results may be stored in an iteration buffer.

In an operation 555, the second set of input voltages may be delivered to the first and second memory arrays to generate a third and fourth set of output currents, respectively. In some examples, the second set of input voltages may be delivered to both crossbar arrays in parallel. The third set of output currents from the first crossbar array may represent an analog multiplication result of the second vector with the first matrix, and a fourth set of output currents from the second crossbar array may represent an analog multiplication result of the second vector with the second matrix. In an operation 565, the third and fourth sets of output currents may be converted, by an ADC, to a third and fourth set of digital intermediate results.

In an operation 580, the first, second, third, and fourth digital intermediate results may be aggregated to generate a combined multiplication result that represents a vector-matrix multiplication of the input vector with the input matrix.

Figure 6:
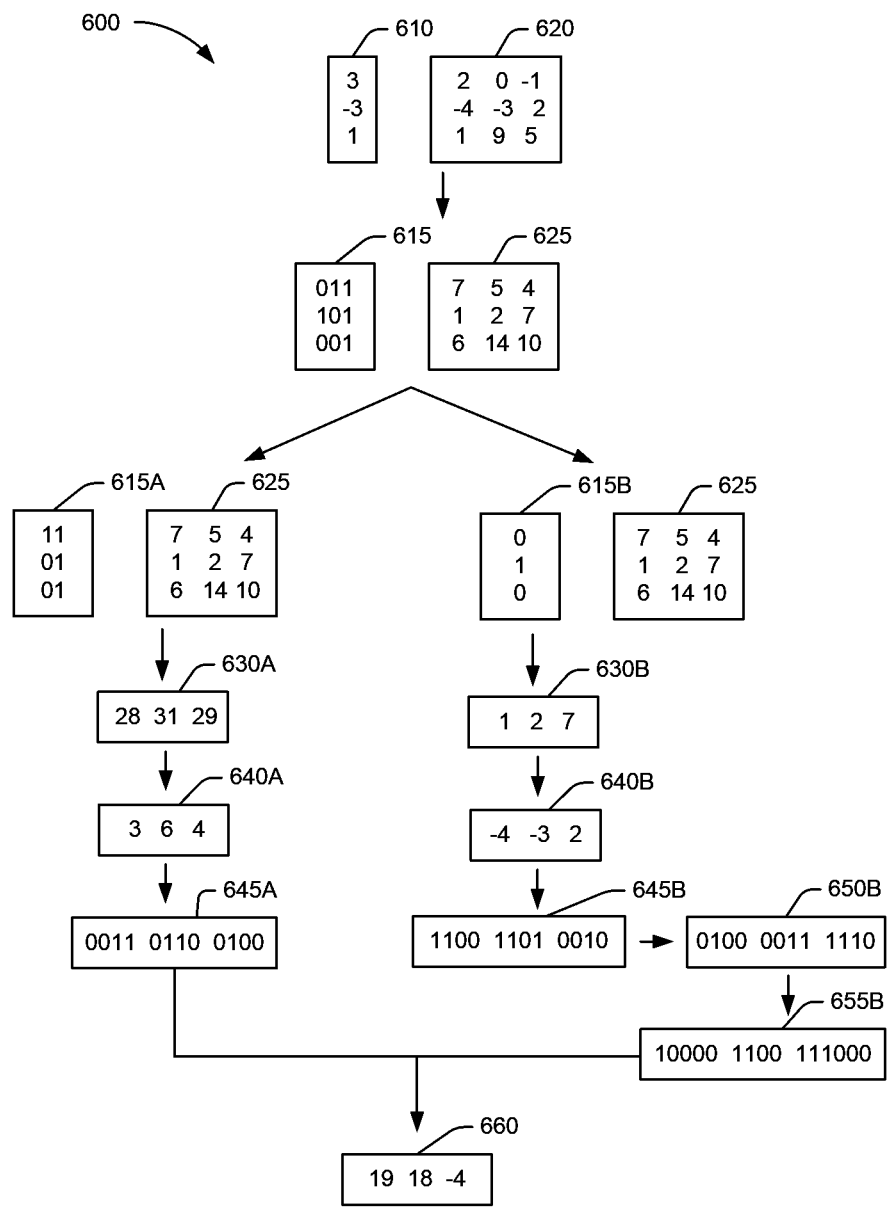
FIG. 6 is a diagram of an example vector-matrix computation.

FIG. 6 conceptually illustrates an example vector-matrix computation 600. The computation illustrated in FIG. 6 may be implemented, for example, by circuit 700 of FIG. 7, which will be concurrently described herein. 610 shows an input vector 610, which includes both positive and negative numbers. 620 shows an input matrix 620, which includes both positive and negative numbers.

Input vector 615 is shown to include 3, −3, and 1, which can be represented in binary in vector 615. Using two's complement to represent negative values, vector 615 may include the values 011, 101, and 011. For example, vector 615 is able to represent the values of input vector 610 using three-bit binary values. In some examples, the most significant bits of the elements of vector 615 may indicate the sign of the elements of the input vector 610. For example, a most significant bit value of 0 may indicate a positive value in input vector 610, while a most significant bit value of 1 may indicate a negative value in input vector 610.

Input matrix 620 is shown to include, the values 2, 0, −1, −4, −3, 2, 1, 9, and 5. Because input matrix 620 is to be mapped to conductance ranges of a memory crossbar array, such as memory crossbar array 720 of FIG. 7, the values of the input matrix 620 is shifted so that the lowest value in input matrix 620 is represented by a lowest positive number. For example, input matrix 620 may be converted to matrix 625 which may include the values, 7, 5, 4, 1, 2, 7, 6, 14, and 10. The values of matrix 625 range from 1 to 14 which is a shifted range from the values of input matrix 620, which range from −4 to 9.

Matrix 625 may be mapped to a crossbar array, such as memory crossbar array 720. As explained previously herein, the lowest conductance of any cell in memory crossbar array 720 may represent the value 1 in matrix 625. The highest conductance of any cell in memory crossbar array 720 may represent the value 14 in matrix 625. For example, the memory crossbar array may be programmed so that the conductance ranges of the memory cells map to matrix 625. Alternatively, the resistance ranges of the memory cells may be used to map to matrix 625.

Figure 7:
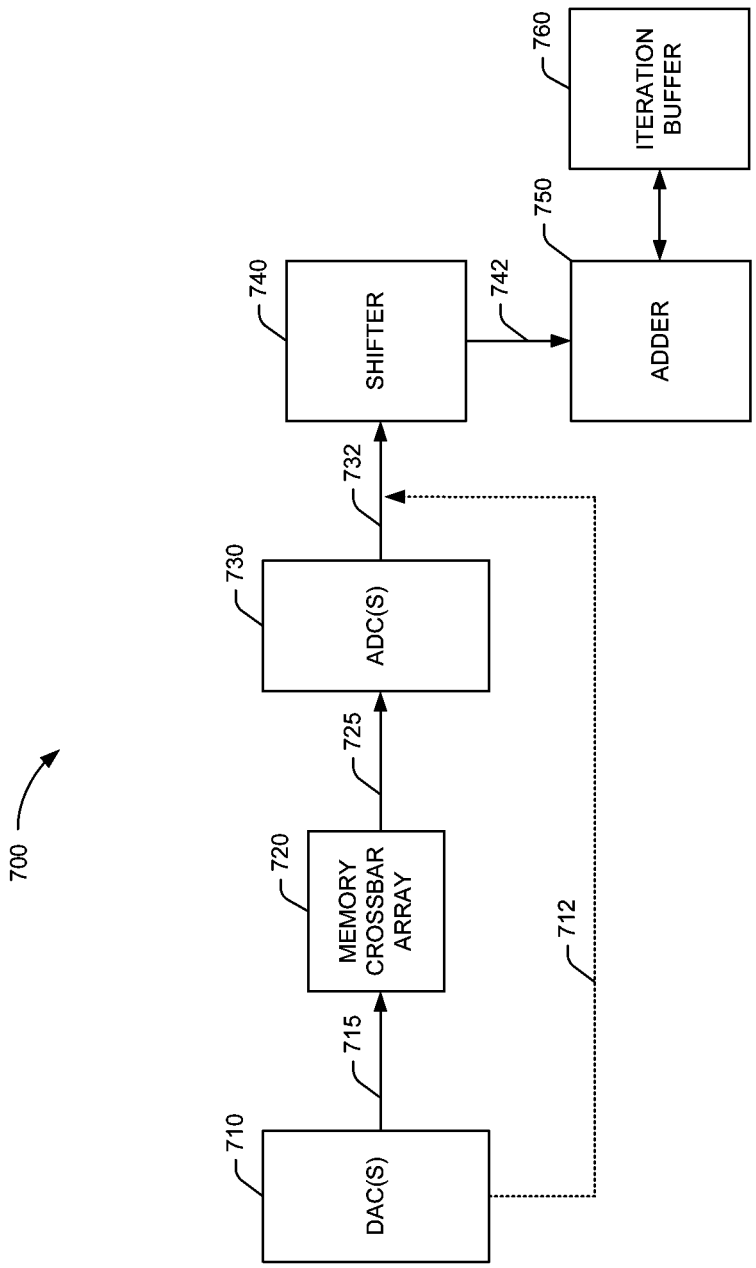
FIG. 7 is a diagram of an example circuit for performing analog vector-matrix computations.

In some examples, vector 615, which represents the binary values of input vector 610, may be segregated into a first vector 615A having the bits representing the value of the vector elements and a second vector 615B having the most significant bits, which represents the sign of each vector element. Concurrently or sequentially, first vector 615A may be converted into a first set of input voltages by a digital-to-analog converter (DAC) such as DAC 710 and second vector 615B may be converted into a second set of input voltages by DAC 710. In the illustration of FIG. 7, both sets of input voltages may be represented by item 715. In some other examples, each bit slice of the vector 615 may be segregated into a vector, where each vector is converted into a set of input voltages.

The first set of input voltages may be delivered to memory crossbar array 720, which is programmed according to the matrix 625. The crossbar array may deliver an analog multiplication result (represented as item 725 in FIG. 7) that represents a vector-matrix multiplication of first vector 615A with matrix 625, which is represented by first analog multiplication result 630A. First result 630A includes 28, 31, and 29, which is the multiply-accumulate result of the first vector 615A with each column of matrix 625. For example, the first element of first vector 615A is 3, the second element is 1, and the third element is 1. Vector values 3, 1, 1 multiplied with the first column values 7, 1, 6 produces a cumulative result of 28.

First analog multiplication result 630A may be adjusted to first adjusted multiplication result 640A according to the shift in the value range of matrix 625. For example, the values of input matrix 620 were shifted +5 to generate matrix 625. Accordingly that +5 may be accounted for when adjusting first result 630A to first adjusted result 640A. For example, the contribution of +5 to the multiplication result of each element of first vector 615A and the matrix 625 is +25 due to 3×5, 1×5, and 1×5. Accordingly, 25 may be subtracted from each result of first multiplication result 630A, resulting in first adjusted multiplication result 640A with values of 3, 6, and 4.

Furthermore, first adjusted multiplication result 640A may be delivered to an analog-to-digital converter (ADC), such as ADC 730 of FIG. 7, to generate a digital value for the analog multiplication results computed by the memory crossbar array. For example, 645A illustrates the digital binary values of first adjusted results 640A. Digital results 645A includes binary values 0011, 0110, and 0100.

Similarly, the second set of input voltages may be delivered to memory crossbar array 720, which is programmed according to the matrix 625. The crossbar array may deliver an analog multiplication result (represented as item 725 in FIG. 7) that represents a vector-matrix multiplication of second vector 615B with matrix 625, which is represented by second analog multiplication result 630B. Second result 630B includes 1, 2, and 7, which is the multiply-accumulate result of the second vector 615B with each column of matrix 625. For example, the first element of second vector 615B is 0, the second element is 1, and the third element is 0. Vector values 0, 1, 1 multiplied with the first column values 7, 1, 6 produces a cumulative result of 1.

Second analog multiplication result 630B may be adjusted to second adjusted multiplication result 640B according to the shift in the value range of matrix 625. For example, the values of input matrix 620 were shifted +5 to generate matrix 625. Accordingly that +5 may be accounted for when adjusting second result 630B to second adjusted result 640B. For example, the contribution of +5 to the multiplication result of each element of second vector 615B and the matrix 625 is +5 due to 0×5, 1×5, and 0×5. Accordingly, 5 may be subtracted from each result of second multiplication result 630B, resulting in first adjusted multiplication result 640B with values of −4, −3, and 2.

Furthermore, second adjusted multiplication result 640B may be delivered to an analog-to-digital converter (ADC), such as ADC 730 of FIG. 7, to generate a digital value for the analog multiplication results computed by the memory crossbar array. For example, 645B illustrates the digital binary values of second adjusted results 640B. Digital results 645B includes binary values 1100, 1101, and 0010.

Because the binary value 1 was assigned to represent the negative sign in input vector 610, second digital results 645B may be subtracted from first digital values 645A. For example, the sign may be tracked and communicated via 712 so that a shift and subtract may be performed rather than a shift and add. For illustration purposes, the elements of second digital results 645B may be converted to their negative counterparts and then added to the first digital results 645A, which may be the equivalent of subtracting the second digital results 645B. Digital results 650B includes the binary values 0100, 0011, and 1110, which represents decimal values 4, 3, and −2. Furthermore, because these results were computed from the most significant bits of vector 615, each element of digital results 650B may be shifted two bits since the most significant bit of vector 615 was the third bit. Digital results 655B illustrates the shifted values 10000, 1100, 111000. In examples, where each bit slice of vector 615 was segregated into a vector, the intermediate multiplication result of each vector with the matrix may be shifted according to the number of the bit slice in the vector.

Shifted digital results 655B, which may be represented in the illustration of FIG. 7 as 742, may be added by an adder, such as adder 750, to digital results 645A to generate a combined multiplication result 660, illustrated in FIG. 7 as 760. Combined result 660 may include the decimal values 19, 18, and −4, which are converted from the binary adder operation. It should be noted that because the addition of the third element of the digital results involves a negative number represented by a two's complement, the conversion of the binary combined result (111100) to the decimal result (−4) should be done accounting for two's complements.

In some examples, where vector 615 was segregated into multiple vectors, each representing a bit slice of the vector 615, each intermediary combined result may be stored in an iteration buffer, such as iteration buffer 760. For example, for a vector with values having three bits, a first vector may represent the most significant bits of the vector, a second vector may represent the second bits of the vector, and a third vector may represent the least significant bits of the vector. The intermediate multiplication result of the third vector with a matrix can be added to the shifted intermediate multiplication result of the second vector with the matrix. The intermediate result of the second vector may be shifted one bit because the second vector had the second bit of the original vector. That combined result may be stored in the iteration buffer until it is pulled back into the adder to combine with the shifted multiplication result of the third vector with the matrix, which may be shifted two bits. Because the third vector is to represent the sign of the values of the original vector, the shifted multiplication result of the third vector with the matrix may be subtracted rather than added. The combined results may then be stored again in the iteration buffer until the final result is generated.

FIG. 7 illustrates an example circuit 700 for performing analog vector-matrix computations, and was herein described above in relation to FIG. 6.

The foregoing describes a number of examples for circuits for handling vector-matrix multiplications involving negative numbers and their applications. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

Further, the sequence of operations described in connection with FIGS. 1-5 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

It should further be noted that, as used in this application and the appended claims, the singular forms "a," "an," and "the" include plural elements unless the context clearly dictates otherwise.

What is claimed is:

1. A circuit, comprising:
a first memory crossbar array and a second memory crossbar array, each to compute analog multiplications, wherein the first memory crossbar array is mapped according to a first matrix comprising positive elements of an input matrix, and the second memory crossbar array is mapped according to a second matrix comprising negative elements of the input matrix;
an analog-to-digital converter (ADC) to generate digital intermediate multiplication results based on analog results computed by the memory crossbar arrays, wherein the digital intermediate multiplication results comprise a first intermediate result corresponding to a multiplication of the first matrix and a first vector comprising positive elements of an input vector, a second intermediate result corresponding to a multiplication of the second matrix and the first vector, a third intermediate result corresponding to a multiplication of the first matrix and a second vector comprising negative elements of the input vector, and a fourth intermediate result corresponding to a multiplication of the second matrix and the second vector; and
a controller to aggregate the digital intermediate results to generate a combined multiplication result.

2. The circuit of claim 1, wherein the controller is to:
segregate the input matrix into the first matrix and the second matrix, wherein the first matrix comprises a copy of the input matrix with the negative elements of the input matrix set to zero in the first matrix, and wherein the second matrix comprises a copy of the input matrix with the positive elements of the input matrix set to zero in the second matrix; and
segregate the input vector into the first vector and the second vector, wherein the first vector comprises a copy of the input vector with the negative elements of the input vector set to zero in the first vector, and wherein the second vector comprises a copy of the input vector with the positive elements of the input vector set to zero in the second vector.

3. The circuit of claim 1, further comprising a digital-to-analog converter (DAC) to generate a first set of input voltages corresponding to the first vector and a second set of input voltages corresponding to the second vector.

4. The circuit of claim 3, wherein the controller is to:
deliver the first set of input voltages to the first memory crossbar array and the second memory crossbar array in parallel; and
deliver the second set of set of input voltages to the first memory crossbar array and the second memory crossbar array in parallel.

5. The circuit of claim 4, wherein each of the first memory crossbar array and the second memory crossbar array comprises a plurality of row lines, a plurality of column lines, and a memory cell coupled between each unique combination of one row line and one column line, wherein:

the row lines of the first memory crossbar array and of the second memory crossbar array are to receive the first set of input voltages and the second set of input voltages; and the column lines of the first memory crossbar array is to deliver a first set of output currents corresponding to the first intermediate result and a third set of output currents corresponding to the third intermediate result, and the column lines of the second memory crossbar array are to deliver a second set of outputs current corresponding to the second intermediate result and a fourth set of output currents corresponding to the fourth intermediate result.

6. The circuit of claim 1, further comprising an iteration buffer to store the digital intermediate results prior to the controller aggregating the intermediate results to generate a combined multiplication result.

7. A hardware accelerator, comprising:
a first crossbar array and a second crossbar array each programmed to compute analog multiplications, wherein each crossbar array comprises a plurality of row lines, a plurality of column lines, and a memory cell coupled between each unique combination of one row line and one column line, wherein:
the memory cells of the first crossbar array are programmed according to positive elements of an input matrix, and the memory cells of the second crossbar array are programmed according to negative elements of the input matrix;
the row lines of the first crossbar array and of the second crossbar array are to receive a first set of input voltages corresponding to positive elements of an input vector and a second set of input voltages corresponding to negative elements of the input vector; and
the column lines of the first crossbar array are to deliver a first set of output currents from the first set of input voltages and a third set of output currents from the second set of input voltages, and the column lines of the second crossbar array are to deliver a second set of output currents from the first set of input voltages and a fourth set of output currents from the second set of input voltages;
an analog-to-digital converter (ADC) to generate a digital intermediate result corresponding to each set of output currents; and
a controller to aggregate the digital intermediate results to generate a combined multiplication result.

8. The hardware accelerator of claim 7, wherein the controller is to:
segregate the input matrix into the first matrix and the second matrix, wherein the first matrix comprises the positive elements of the input matrix, and wherein the second matrix comprises the negative elements of the input matrix; and
segregate the input vector into the first vector and the second vector, wherein the second vector comprises the positive elements of the first vector, and wherein the third vector comprises the negative elements of the first vector.

9. The hardware accelerator of claim 8, wherein:
the first matrix comprises a copy of the input matrix with the negative elements of the input matrix set to zero in the first matrix;
the second matrix comprises a copy of the input matrix with the positive elements of the input matrix set to zero in the second matrix;
the first vector comprises a copy of the input vector with the negative elements of the input vector set to zero in the first vector; and
the second vector comprises a copy of the input vector with the positive elements of the input vector set to zero in the second vector.

10. A circuit, comprising:
a memory crossbar array to compute analog multiplications, wherein the memory crossbar array is programmed according to an input matrix;
a digital-to analog converter (DAC) to generate a set of analog voltage values corresponding to an input vector;
an analog-to-digital converter (ADC) to generate a digital value for the analog multiplication results computed by the memory crossbar array;
a shifter to shift the digital value of a first analog multiplication result a predetermined number of bits to generate a shifted result, wherein the digital value of the first analog multiplication result corresponds to a multiplication of a first vector with the input matrix wherein the first vector comprises the most significant bits of elements of the input vector; and
an adder to add or subtract the shifted result to the digital value of a second multiplication result to generate a combined multiplication result, wherein the digital value of the second multiplication result corresponds to a multiplication of a second vector with the input matrix wherein the second vector comprises other bits of the elements of the input vector.

11. The circuit of claim 10, wherein the most significant bits of the elements of the input vector indicate the sign of the elements of the input vector.

12. The circuit of claim 11, wherein elements of the input vector having a negative value are represented by their two's complement values.

13. The circuit of claim 12, wherein the memory crossbar array comprises a plurality of row lines, a plurality of column lines, and a memory cell coupled between each unique combination of one row line and one column line, wherein:
the conductance level of each memory cell is programmed according to the elements of the input matrix, wherein a lowest programmed conductance level of the memory cells corresponds to the lowest value of input matrix, a highest programmed conductance level of the memory cells corresponds to the highest value of the input matrix, and all other conductance levels correspond to the relative values of corresponding elements of the input matrix.

14. The circuit of claim 13, wherein:
the row lines of the memory crossbar array are to receive the set of analog voltage values; and
the column lines of the memory crossbar array are to deliver a set of output currents corresponding to an analog multiplication result.

15. The circuit of claim 12, wherein the circuit tracks the sign of the elements of the input vector and decides whether the adder is to add or subtract the shifted result to the digital value of the second multiplication result to generate the combined multiplication result.

* * * * *